US012696824B2

(12) United States Patent
Otremba et al.

(10) Patent No.: US 12,696,824 B2
(45) Date of Patent: Jul. 28, 2026

(54) SURFACE MOUNT PACKAGE HAVING AN INTERNAL REDUNDANT ELECTRICAL CONNECTION

(71) Applicant: Infineon Technologies Austria AG, Villach (AT)

(72) Inventors: Ralf Otremba, Kaufbeuren (DE); Edward Fürgut, Dasing (DE); Uwe Kirchner, Witra (AT); Leo Aichriedler, Puch (AT); Florian Lindner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 407 days.

(21) Appl. No.: 18/544,595

(22) Filed: Dec. 19, 2023

(65) Prior Publication Data

US 2025/0201682 A1     Jun. 19, 2025

(51) Int. Cl.
| | |
|---|---|
| *H01L 23/495* | (2006.01) |
| *H01L 23/31* | (2006.01) |
| *H10W 70/40* | (2026.01) |
| *H10W 74/10* | (2026.01) |
| *H10W 90/00* | (2026.01) |
| *H10W 80/00* | (2026.01) |

(52) U.S. Cl.
CPC ........ *H10W 90/811* (2026.01); *H10W 70/465* (2026.01); *H10W 70/481* (2026.01); *H10W 74/111* (2026.01); *H10W 90/00* (2026.01); *H10W 80/721* (2026.01); *H10W 90/752* (2026.01); *H10W 90/756* (2026.01); *H10W 90/796* (2026.01)

(58) Field of Classification Search
None
See application file for complete search history.

(56) References Cited

U.S. PATENT DOCUMENTS

| | | | |
|---|---|---|---|
| 9,524,941 B2 | 12/2016 | Otremba | |
| 2024/0304507 A1* | 9/2024 | Dezsi | .......... H10W 70/481 |

OTHER PUBLICATIONS

"N-channel 600 V, 48 mΩ typ., 34 A MDmesh M6 Power MOSFET in a TO-LL package", ST Life Augmented, STO67N60M6 Data Sheet Rev. 2, Apr. 2021, pp. 1-15.

* cited by examiner

*Primary Examiner* — Asok K Sarkar
(74) *Attorney, Agent, or Firm* — Murphy, Bilak & Homiller, PLLC

(57) ABSTRACT

A molded surface mount package includes: a power semiconductor die attached to a metallic pad with a first side facing the pad and a second (opposite) side facing away from the pad, the metallic pad forming a first power terminal exposed at a surface mounting side of the package; a second power terminal, a first sense terminal, and a gate terminal each exposed at the surface mounting side and spaced apart from the first power terminal; a first electrical connection between the second power terminal and a first power pad at the second side of the die; a second electrical connection between the gate terminal and a gate pad at the second side of the die; a third electrical connection between the first sense terminal and a first sense pad at the second side of the die; and a first redundant electrical connection for the second or third electrical connection.

22 Claims, 7 Drawing Sheets

100

900

SURFACE MOUNT PACKAGE HAVING AN INTERNAL REDUNDANT ELECTRICAL CONNECTION

BACKGROUND

Power semiconductors are increasingly being used in mission-critical applications such as medical devices with essential performance (e.g. defibrillators), space applications, railway electric traction, and automotive. For these and other mission-critical applications, safe and reliable operation of the power semiconductor devices is required over their entire specified lifetime. Molded power semiconductor packages are typically designed with only a single internal connection for sense functions (e.g., Kelvin, temperature, or current) and a single internal connection for the control (gate) function. Failure of a single internal sense connection or of the single internal gate connection could lead to overall device failure or inoperability.

Thus, there is a need for an improved molded power semiconductor package design for mission-critical applications where device failure can be catastrophic.

SUMMARY

According to an embodiment of a surface mount package, the surface mount package comprises: a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount package; a second power terminal, a first sense terminal, and a gate terminal each exposed at the surface mounting side and spaced apart from the first power terminal; a first electrical connection between the second power terminal and a first power pad at the second side of the power semiconductor die; a second electrical connection between the gate terminal and a gate pad at the second side of the power semiconductor die; a third electrical connection between the first sense terminal and a first sense pad at the second side of the power semiconductor die; a first redundant electrical connection for the second electrical connection or the third electrical connection; and a mold compound encasing each of the power semiconductor die, the first electrical connection, the second electrical connection, the third electrical connection, and the first redundant electrical connection.

According to an embodiment of a surface mount system-in-package, the surface mount system-in-package comprises: a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount system-in-package; an additional semiconductor die attached to the same or different metallic pad as the power semiconductor die, the additional semiconductor die comprising a driver device configured to provide a drive input for a gate of a power transistor included in the power semiconductor die; a second power terminal, a first sense terminal, and a gate terminal each exposed at the surface mounting side and spaced apart from the first power terminal; a first electrical connection between the second power terminal and a first power pad at the second side of the power semiconductor die; a second electrical connection between the gate terminal and a driver input pad of the additional semiconductor die; a third electrical connection between the first sense terminal and a first sense pad at the second side of the power semiconductor die; a first redundant electrical connection for the second electrical connection or the third electrical connection; and a mold compound encasing each of the power semiconductor die, the additional semiconductor die, the first electrical connection, the second electrical connection, the third electrical connection, and the first redundant electrical connection.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a design for molded power semiconductor packages, including molded surface mount system-in-packages, that have built-in internal redundancy for sense and/or control (gate) functionality. More than one type of sense functionality may be supported by a particular molded package. For example, a package may implement current sense, temperature sense and/or Kelvin sense functionality. A redundant electrical connection encased by the mold compound of the package may be provided for each sense functionality supported by the package, or for a subset of the supported sense functionalities. A redundant electrical connection encased by the mold compound of the package may be provided for the gate (control) functionality, separate from and/or in addition to any redundant sense connection.

Minimally with respect to the redundancy feature, each molded package described herein includes a redundant electrical connection for either a sense electrical connection or a gate (control) electrical connection encased by the package mold compound. The packages may include a redundant electrical connection for sense and gate (control) electrical connections encased by the package mold compound. Also, the molded packages described herein are surface mount devices (SMDs) such that the molded packages are leadless or short-lead surface mount components designed to be mounted to the surface of a printed circuit board (PCB) or other type of substrate, as opposed to through-hole technology where leads on a component are inserted through holes drilled in a PCB and soldered to pads on the opposite side of the board.

Described next, with reference to the figures, are exemplary embodiments of molded power semiconductor packages, including molded surface mount system-in-packages, with internal redundancy for sense and/or control (gate) connections encased by the package mold compound.

Figures 1A, 1B:
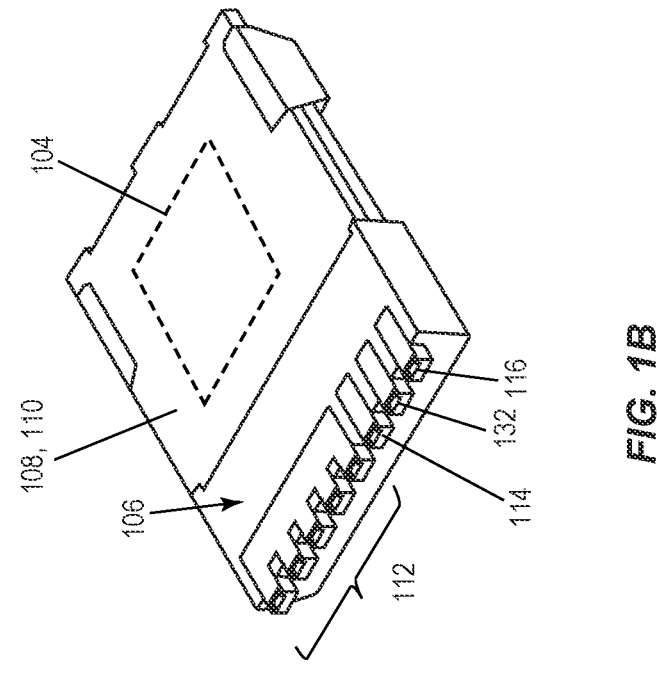
FIG. 1A illustrates a top perspective view of a molded surface mount package.
FIG. 1B illustrates a bottom perspective view of the molded surface mount package.

FIG. 1A illustrates a top perspective view of a molded surface mount package 100 and FIG. 1B illustrates a bottom perspective view of the package 100. The molded surface mount package 100 includes a mold compound 102 and a power semiconductor die (chip) 104 encased by the mold compound 102. The mold compound 102 is a plastic encapsulant typically formed from an organic resin such as an epoxy resin. The plastic encapsulant may include fillers such as non-melting inorganic materials. Catalysts may be used to accelerate the cure reaction of the organic resin. Other materials such as flame retardants, adhesion promoters, ion traps, stress relievers, colorants, etc. may be added to the plastic encapsulant, as appropriate.

The power semiconductor die 104 encased by the mold compound 102 forms part of a power electronics circuit such as a DC/AC inverter, a DC/DC converter, an AC/DC converter, a DC/AC converter, an AC/AC converter, a multiphase inverter, an H-bridge, etc. The power semiconductor die 104 may be a power transistor die, a power diode die, a half bridge die, etc., or a die that combines logic and power devices on the same semiconductor substrate. In one embodiment, the power semiconductor die 104 is a power transistor die such as a power Si MOSFET (metal-oxide-semiconductor field-effect transistor) die, an IGBT (insulated gate bipolar transistor) die, a SiC MOSFET die, a GaN HEMT (high electron mobility transistors) die, a JFET (function field-effect transistor) die, etc.

The power semiconductor die 104 is obstructed by the mold compound 102 in the views of FIGS. 1A and 1B and therefore illustrated using a dashed rectangle in FIGS. 1A and 1B. More than one power semiconductor die 104 may be included in the molded surface mount package 100. The molded package 100 may be a leadless or leaded package. Leaded SMD (surface mount device) packages have small (leads) legs jutting out from the side face of the package and bent downward for surface mounting to a PCB or other type of substrate. The surface mount contact points of leadless SMD packages are disposed at the surface mounting side of the package, as exemplified in FIGS. 1A and 1B.

Figure 1C:
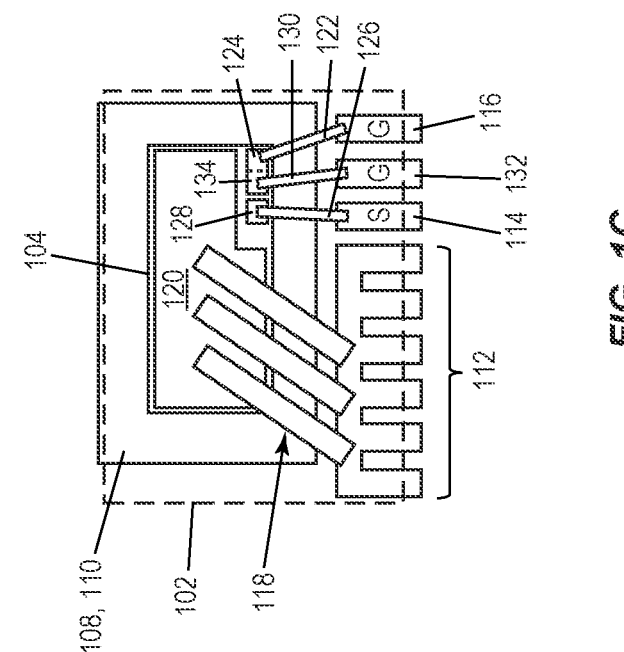
FIG. 1C illustrates a top plan view of the molded surface mount package looking through the mold compound.

For either the leaded or leadless SMD case, the surface mounting side 106 of the molded package 100, which is visible in FIG. 1B, is designed to be mounted to the surface of a PCB or other type of substrate. Accordingly, the molded package 100 does not utilize through-hole technology. FIG. 1C illustrates a top plan view of the molded surface mount package 100 looking through the mold compound 102, to provide an unobstructed view of the package interior. Accordingly, a dashed rectangle is used in FIG. 1C to represent the mold compound 102.

The power semiconductor die 104 is attached to a metallic pad 108 such that a first (e.g., back) side of the power semiconductor die 104 faces the metallic pad 108 and a second (e.g., front) side opposite the first side faces away from the metallic pad 108. The power semiconductor die 104 may be attached to the metallic pad 108 by gluing, soldering, diffusion soldering, brazing, etc. The metallic pad 108 forms a first power terminal 110 exposed from the mold compound 102 at the surface mounting side 106 of the molded package 100.

A second power terminal 112, a first sense (S) terminal 114, and a gate (G) terminal 116 are each exposed from the mold compound 102 at the surface mounting side 106 of the molded package 100 and spaced apart from the first power terminal 110. In one embodiment, the metallic pad 108 is a die pad of a lead frame and the second power terminal 112, the first sense terminal 114, and the gate terminal 116 are separate leads of the lead frame. The lead frame may be formed by processing a metallic sheet, e.g., by punching, coining, stamping, etching, cutting, etc. to define the metallic pad 108, the second power terminal 112, the first sense terminal 114, and the gate terminal 116.

As illustrated in FIG. 1C, a first internal electrical connection 118 is provided between the second power terminal 112 of the molded surface mount package 100 and a first power pad 120 at the second side of the power semiconductor die 104. A second internal electrical connection 122 is provided between the gate terminal 116 of the molded surface mount package 100 and a gate pad 124 at the second side of the power semiconductor die 104. A third internal electrical connection 126 is provided between the first sense terminal 114 of the molded surface mount package 100 and a first sense pad 128 at the second side of the power semiconductor die 104. The first sense die pad 128 may be a current sense pad, a temperature sense pad, or a Kelvin sense pad.

In FIGS. 1A through 1C, a redundant internal electrical connection 130 is provided for the second (gate) internal electrical connection 122. The redundant internal gate electrical connection 130 is between a redundant gate terminal 132 exposed at the surface mounting side 106 of the molded package 100 and a redundant gate pad 134 at the second side of the power semiconductor die 104. The redundant gate die pad 134 is electrically connected to the same gate electrodes of a power transistor included in the power semiconductor die 104 as the main gate die pad 116. If the internal electrical connection 122 between the package gate terminal 116 and the gate die pad 124 fails for any reason, the redundant internal gate electrical connection 130 ensures continued operation of the power transistor included in the power semiconductor die 104.

Also in FIGS. 1A through 1C, the internal electrical connections 118, 122, 126, 130 are shown as being implemented using bond wires. However, one or more of the internal electrical connections 118, 122, 126, 130 instead may be implemented using metal ribbons, metallic clips, etc. The internal electrical connections 118, 122, 126, 130 may be made of any type of metal or metal alloy suitable for implementing internal package connections, such Al, Cu, Au, Ag, etc. In each case, the mold compound 102 encases each of the power semiconductor die 104, the first internal electrical connection 118, the second internal electrical connection 122, the third internal electrical connection 126, and the redundant internal electrical connection 130.

The power semiconductor die 104 may be a vertical device or a lateral device. For a lateral device, all electrical contact pads are at the second side of the power semiconductor die 104 and the primary current path is along this side of the die 104. For a vertical device, the load pads are at opposite sides of the power semiconductor die 104 and the primary current path is between these sides of the die 104.

In FIGS. 1A through 1C, the power semiconductor die 104 is a vertical power semiconductor die. According to this embodiment, the metallic pad 108 is attached and electrically connected to a second power pad at the first side of the power semiconductor die 104. The power pad at the first side of the power semiconductor die 104 is out of view in FIGS. 1A through 1C but may be a drain pad in the case of a vertical power MOSFET or a collector pad in the case of an IGBT, as examples. In the case of a vertical power MOSFET, the first power pad 120 at the second side of the power semiconductor die 104 may be a source pad. In the case of a vertical IGBT, the first power pad 120 at the second side of the power semiconductor die 104 may be an emitter pad. A lateral power semiconductor die embodiment is described later.

Figure 2:
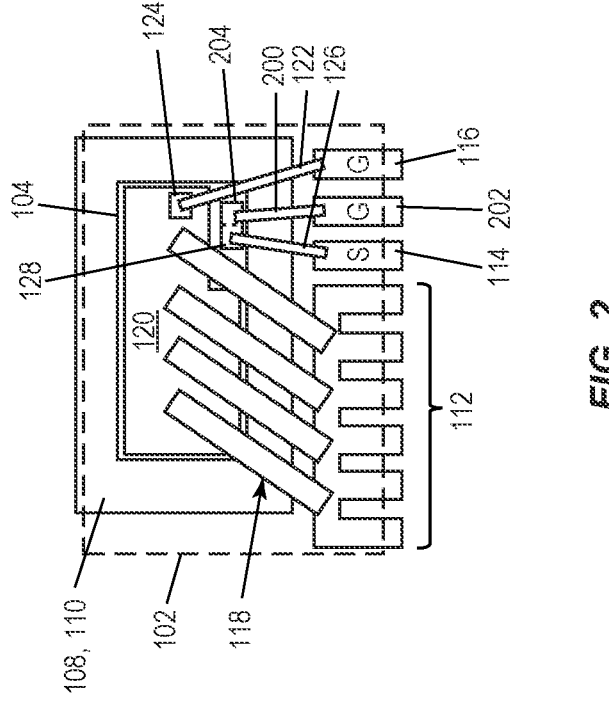
FIG. 2 illustrates a top plan view of the molded surface mount package looking through the mold compound, according to another embodiment.

FIG. 2 illustrates a top plan view of the molded surface mount package 100 looking through the mold compound 102, according to another embodiment. In FIG. 2, a redundant internal electrical connection 200 is provided between a redundant sense terminal 202 exposed at the surface mounting side 106 of the molded package 100 and a redundant sense pad 204 at the second side of the power semiconductor die 104. The redundant sense pad 204 is electrically connected to the same sense circuitry or sense structure integrated in the power semiconductor die 104 as the first sense die pad 128. The mold compound 102 encases the redundant internal sense electrical connection 200. If the internal electrical connection 126 between the first package sense terminal 114 and the first die sense pad 128 fails for any reason, the redundant internal sense connection 200 ensures continued access to the sense signal.

Figure 3:
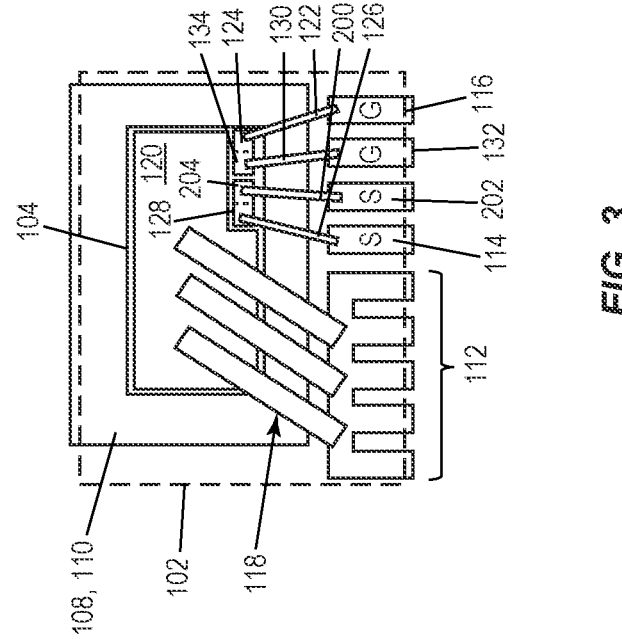
FIG. 3 illustrates a top plan view of the molded surface mount package looking through the mold compound, according to another embodiment.

FIG. 3 illustrates a top plan view of the molded surface mount package 100 looking through the mold compound 102, according to another embodiment. The embodiment of FIG. 3 combines the redundant gate connection feature of the embodiment shown in FIGS. 1A through 1C and the redundant sense connection feature of the embodiment shown in FIG. 2. In FIG. 3, the first redundant internal electrical connection 130 is between the redundant gate terminal 132 exposed at the surface mounting side 106 of the molded package and the redundant gate pad 134 at the second side of the power semiconductor die 104. The second redundant internal electrical connection 200 is between the redundant sense terminal 202 exposed at the surface mounting side 106 of the molded package 100 and the redundant sense pad 204 at the second side of the power semiconductor die 104. According to this embodiment, the molded surface mount package 100 includes internal redundancy for both the gate and sense connections to the power semiconductor die 104.

Figure 4:
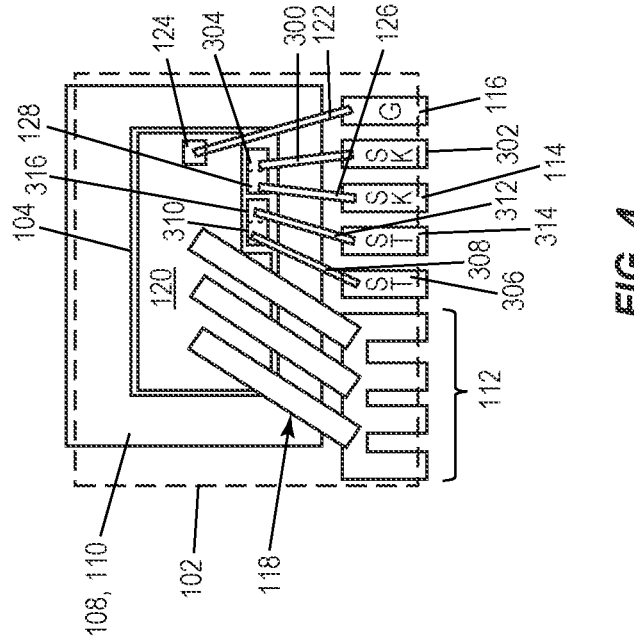
FIG. 4 illustrates a top plan view of the molded surface mount package looking through the mold compound, according to another embodiment.

FIG. 4 illustrates a top plan view of the molded surface mount package 100 looking through the mold compound 102, according to another embodiment. In FIG. 4, the first sense pad 128 at the second side of the power semiconductor die 104 is a Kelvin sense pad and the first sense terminal 114 exposed at the surface mounting side 106 of the molded package 100 is a Kelvin sense (SK) terminal. According to this embodiment, a redundant internal electrical connection 300 is provided between a redundant Kelvin sense terminal 302 exposed at the surface mounting side 106 of the molded package 100 and a redundant Kelvin sense pad 304 at the second side of the power semiconductor die 104. The redundant Kelvin sense pad 304 is electrically connected to the same Kelvin sense structure integrated in the power semiconductor die 104 as the main Kelvin sense die pad 128. The mold compound 102 encases the redundant internal Kelvin sense connection 300.

In FIG. 4, the molded surface mount package 100 further includes a temperature sense (ST) terminal 306 exposed at the surface mounting side 106 of the molded package 100 and an internal electrical connection 308 between the temperature sense terminal 306 and a temperature sense pad 310 at the second side of the power semiconductor die 104. A redundant internal electrical connection 312 is provided for the internal temperature sense electrical connection 308 in case the internal temperature sense electrical connection 308 fails. The mold compound 102 encases the internal temperature sense electrical connection 308 and the redundant internal temperature sense electrical connection 312.

In FIG. 4, the redundant internal temperature sense electrical connection 312 is provided between a redundant temperature sense terminal 314 exposed at the surface mounting side 106 of the molded package 100 and a redundant temperature sense pad 316 at the second side of the power semiconductor die 104. The redundant temperature sense pad 316 is electrically connected to the same temperature sense circuitry integrated in the power semiconductor die 104 as the main temperature sense die pad 310.

Figure 5:
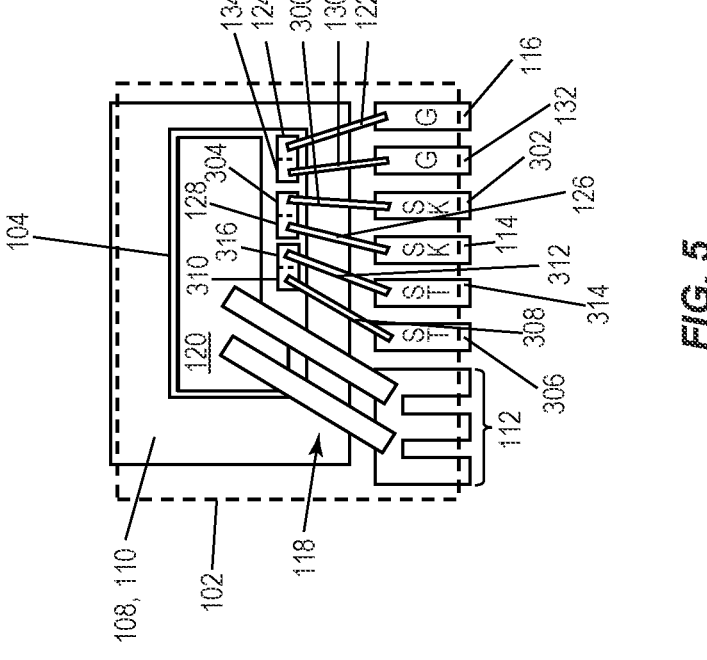
FIG. 5 illustrates a top plan view of the molded surface mount package looking through the mold compound, according to another embodiment.

FIG. 5 illustrates a top plan view of the molded surface mount package 100 looking through the mold compound 102, according to another embodiment. The embodiment of FIG. 5 combines the redundant gate connection feature of the embodiment shown in FIGS. 1A through 1C and the dual redundant sense connection feature of the embodiment shown in FIG. 4. In FIG. 5, the molded surface mount package 100 has a redundant internal gate electrical connection 130 for the internal gate electrical connection 122, a first redundant internal sense electrical connection 300 for the internal Kelvin sense electrical connection 126, and a second redundant internal sense electrical connection 312 for the internal temperature sense electrical connection 308. Each redundant internal electrical connection 130, 300, 312 is encased by the mold compound 102.

Figure 6:
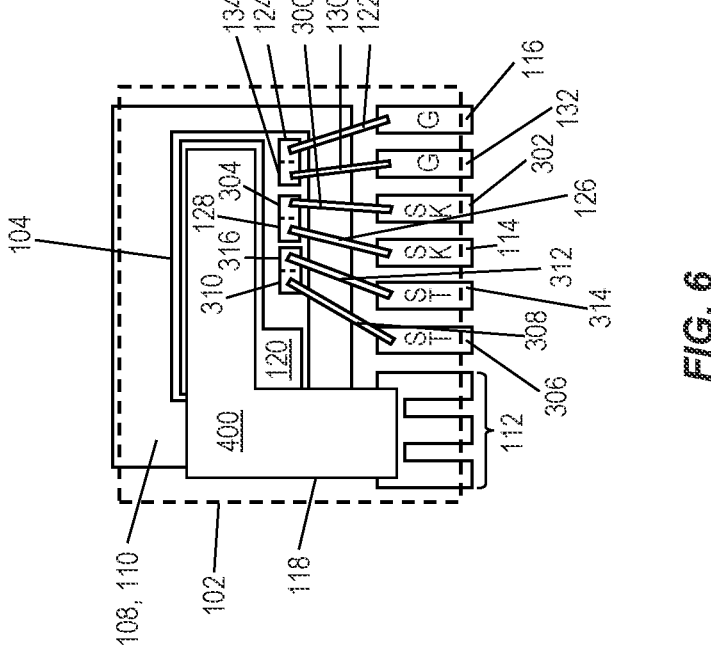
FIG. 6 illustrates a top plan view of the molded surface mount package looking through the mold compound, according to another embodiment.

FIG. 6 illustrates a top plan view of the molded surface mount package 100 looking through the mold compound 102, according to another embodiment. The embodiment of FIG. 6 is similar to the embodiment of FIG. 5. However, in FIG. 6, the internal electrical connection 118 between the second power terminal 112 of the molded package 100 and the first power pad 120 of the power semiconductor die 104 is implemented using a metallic clip 400 such as Cu clip.

As explained above, the molded surface mount package 100 may implement current sense, temperature sense and/or Kelvin sense functionality. FIGS. 1C, 2 and 3 illustrate a single type of sensing (e.g., current, temperature or Kelvin) provided by the power semiconductor die 104. FIGS. 4 and 5 illustrate temperature and Kelvin sensing provided by the power semiconductor die 104. In FIGS. 4 and 5, the Kelvin sensing or temperature sensing functionality implemented by the power semiconductor die 104 may be replaced by temperature sensing.

In the case of the power semiconductor die 104 implementing current sense, temperature sense and Kelvin sense functionality, the surface mount package 100 may further include a current sense terminal exposed at the surface mounting side 106 of the package 100, an internal electrical connection between the current sense terminal and a current sense pad at the second side of the power semiconductor die 104, and a redundant internal electrical connection for the current sense electrical connection, with the mold compound 102 encasing the additional electrical connections. For example, the redundant internal current sense electrical connection may be between a redundant current sense terminal exposed at the surface mounting side 106 of the molded package 100 and a redundant current sense pad at the second side of the power semiconductor die 104.

Figure 7:
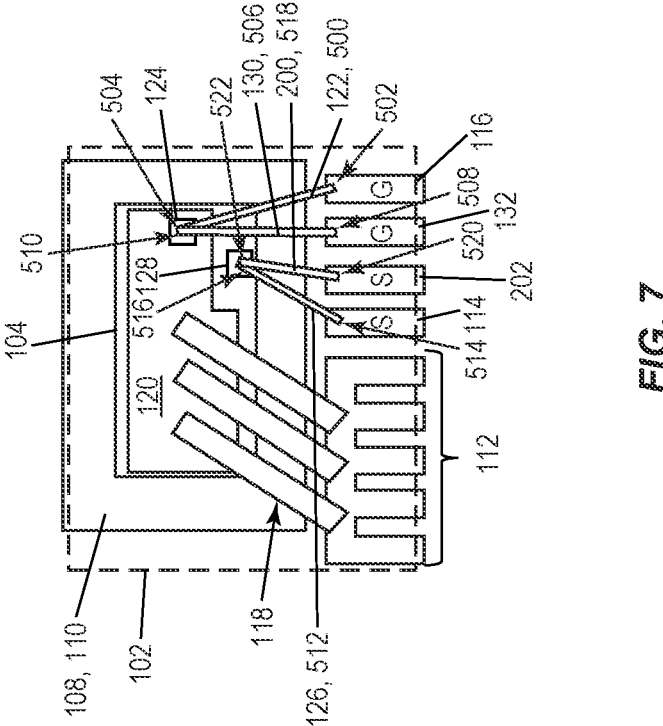
FIG. 7 illustrates a top plan view of the molded surface mount package looking through the mold compound, according to another embodiment.

FIG. 7 illustrates a top plan view of the molded surface mount package 100 looking through the mold compound 102, according to another embodiment. In FIG. 7, the redundant internal gate electrical connection 130 is between the redundant gate terminal 132 exposed at the surface mounting side 106 of the molded package 100 and the main gate pad 124 at the second side of the power semiconductor die 104. That is, according to this embodiment, the power semiconductor die 104 does not have a redundant gate pad.

In FIG. 7, the internal gate electrical connection 122 is implemented using a first bond wire 500 having a first end 502 attached to the gate terminal 116 exposed at the surface mounting side 106 of the molded package 100 and a second end 504 attached to the gate die pad 124. The redundant internal gate connection 130 includes a second bond wire 506 having a first end 508 attached to the redundant gate terminal 132 exposed at the surface mounting side 106 of the molded package 100 and a second end 510 stacked on and attached to the second end 504 of the first bond wire 500. For example, the second ends 504, 510 of the gate bond wires 500, 506 may form a wedge-on-wedge bond or a ball-on-ball bond, depending on the type of wire bond technology used.

As shown in FIG. 7, the molded surface mount package 100 may have at least one redundant internal sense connection 200, e.g., for an internal temperature sense, current sense and/or Kelvin sense connection. In FIG. 7, the internal sense electrical connection 126 is implemented using a bond wire 512 having a first end 514 attached to the respective sense terminal 114 exposed at the surface mounting side 106 of the molded package 100 and a second end 516 attached to the respective sense pad 128 at the second side of the power semiconductor die 104. The corresponding redundant internal sense electrical connection 200 is implemented using a second bond wire 518 having a first end 520 attached to the respective redundant sense terminal 202 exposed at the surface mounting side 106 of the molded package 100 and a second end 522 stacked on and attached to the second end 516 of the first sense bond wire 512. For example, the second ends 516, 522 of the sense bond wires 512, 518 may form a wedge-on-wedge bond or a ball-on-ball bond, depending on the type of wire bond technology used.

Figure 8:
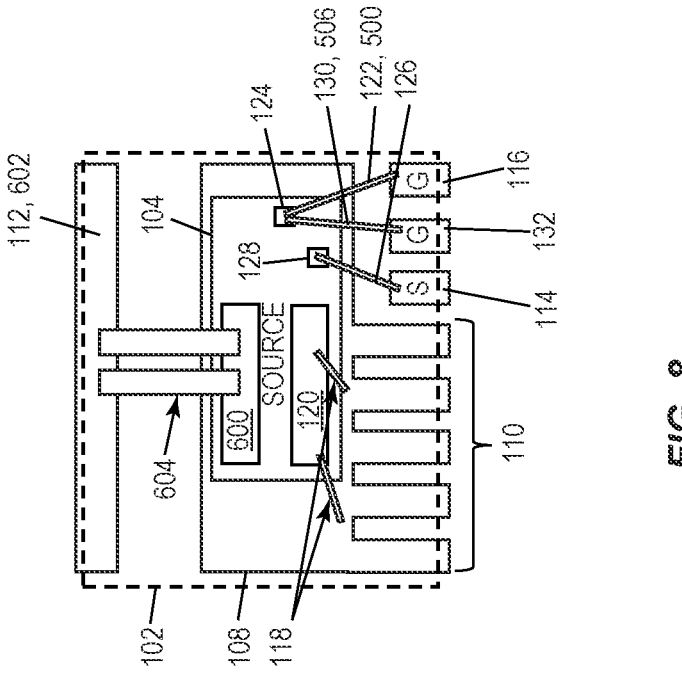
FIG. 8 illustrates a top plan view of the molded surface mount package looking through the mold compound, according to another embodiment.

FIG. 8 illustrates a top plan view of the molded surface mount package 100 looking through the mold compound 102, according to another embodiment. In FIG. 8, the power semiconductor die 104 is a lateral device with all electrical contact pads 120, 124, 128, 600 at the second (front) side of the die 104 and the primary current path along this side of the die 104. A separate lead 602 forms the second power terminal 112 exposed at the surface mounting side 106 of the molded package 100.

Also in FIG. 8, the first power pad 120 at the second side of the power semiconductor die 104 is a source pad and the first power terminal 110 provides source potential to the source pad 120 via the first internal electrical connection 118. A drain pad 600 at the second side of the power semiconductor die 104 is spaced apart from the source pad 120 and electrically connected to the second power terminal 112 via an additional internal electrical connection 604. The additional internal electrical connection 604 is encased by the mold compound 102 and may be implemented as one or more wire ribbons, a plurality of bond wires, a metal clip, etc.

Figure 11:
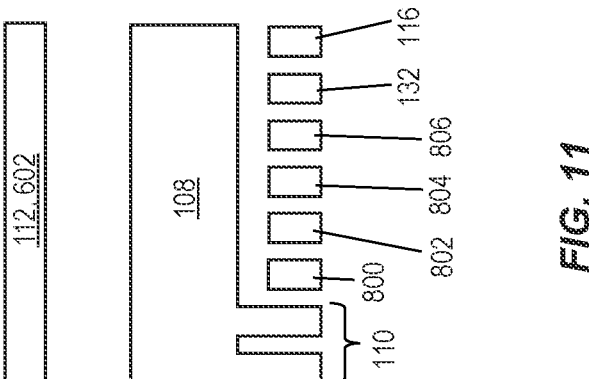
FIGS. 9 through 11 illustrate respective lead frame designs that accommodate different redundant internal sense and/or gate electrical connections for the lateral device implementation shown in FIG. 8.
Figure 10:
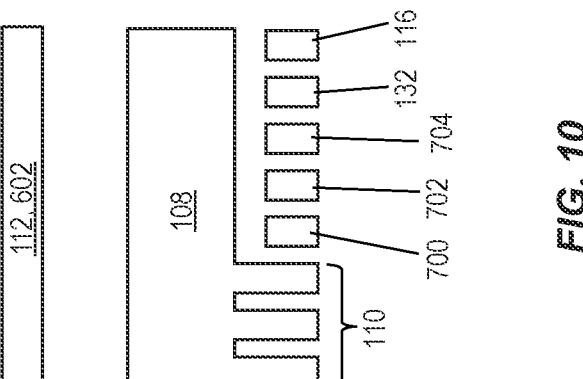
Figure 9:
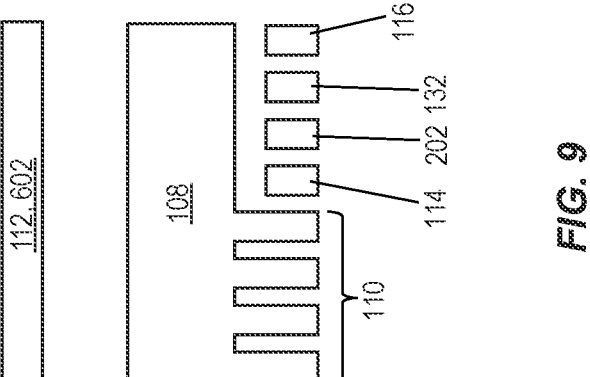

A redundant internal gate electrical connection 130 realized by two bond wires 500, 506 attached to the same gate die pad 124 is illustrated in FIG. 8 and can be implemented as explained above in connection with FIG. 7. More generally, the lateral device implementation shown in FIG. 8 may incorporate any of the redundant internal sense and/or gate electrical connection embodiments described above in connection with FIGS. 1A through 7. FIGS. 9 through 11 illustrate respective lead frame designs that accommodate different redundant internal sense and/or gate electrical connections for the lateral device implementation shown in FIG. 8.

In FIG. 9, the lead frame includes the main gate terminal 116, a redundant gate terminal 132, a sense terminal 114 and a redundant sense terminal 202. The sense terminal 114 may be used for current sensing, temperature sensing or Kelvin sensing. The redundant gate terminal 132 may be electrically connected to a redundant gate pad 134 of the power semiconductor die 104, e.g., as shown in FIGS. 1C, 3, 5, 6, or to the main gate pad 124 of the power semiconductor die 104, e.g., as shown in FIG. 7. The redundant sense terminal 202 may be electrically connected to a redundant sense pad 204/304/316 of the power semiconductor die 104, e.g., as shown in FIGS. 2 through 6, or to a main sense pad 128/310 of the power semiconductor die 104, e.g., as shown in FIG. 7.

In FIG. 10, the lead frame includes the main gate terminal 116, a redundant gate terminal 132, and three sense-related terminals 700, 702, 704. The redundant gate terminal 132 may be electrically connected to a redundant gate pad 134 of the power semiconductor die 104, e.g., as shown in FIGS. 1C, 3, 5, 6, or to the main gate pad 124 of the power semiconductor die 104, e.g., as shown in FIG. 7. The sense-related terminals 700, 702, 704 may be used to implement current sensing, temperature sensing, and Kelvin sensing without internal redundancy. Alternatively, two of the sense-related terminals 700, 702, 704 may be used to implement current sensing, temperature sensing or Kelvin sensing with internal redundancy, e.g., as shown in FIGS. 2 through 7, with the remaining sense-related terminal 700/ 702/704 providing a different type of sense functionality without internal redundancy.

In FIG. 11, the lead frame includes the main gate terminal 116, a redundant gate terminal 132, and four sense-related terminals 800, 802, 804, 806. The redundant gate terminal 132 may be electrically connected to a redundant gate pad 134 of the power semiconductor die 104, e.g., as shown in FIGS. 1C, 3, 5, 6, or to the main gate pad 124 of the power semiconductor die 104, e.g., as shown in FIG. 7. The sense-related terminals 800, 802, 804, 806 may be used to implement current sensing, temperature sensing, and Kelvin sensing with internal redundancy for one of the sense functionalities, e.g., as shown in FIGS. 2 through 7. Alternatively, two of the sense-related terminals 800, 802, 804, 806 may be used to implement one type of sense functionality (e.g., current, temperature or Kelvin) with internal redundancy and the remaining two sense-related terminals 800, 802, 804, 806 may be used to implement a different type of sense functionality with internal redundancy, e.g., as shown in FIGS. 2 through 7. Other lead frame configurations may be used, depending on the design of the power semiconductor die 104 and the molded package 100.

Figure 12:
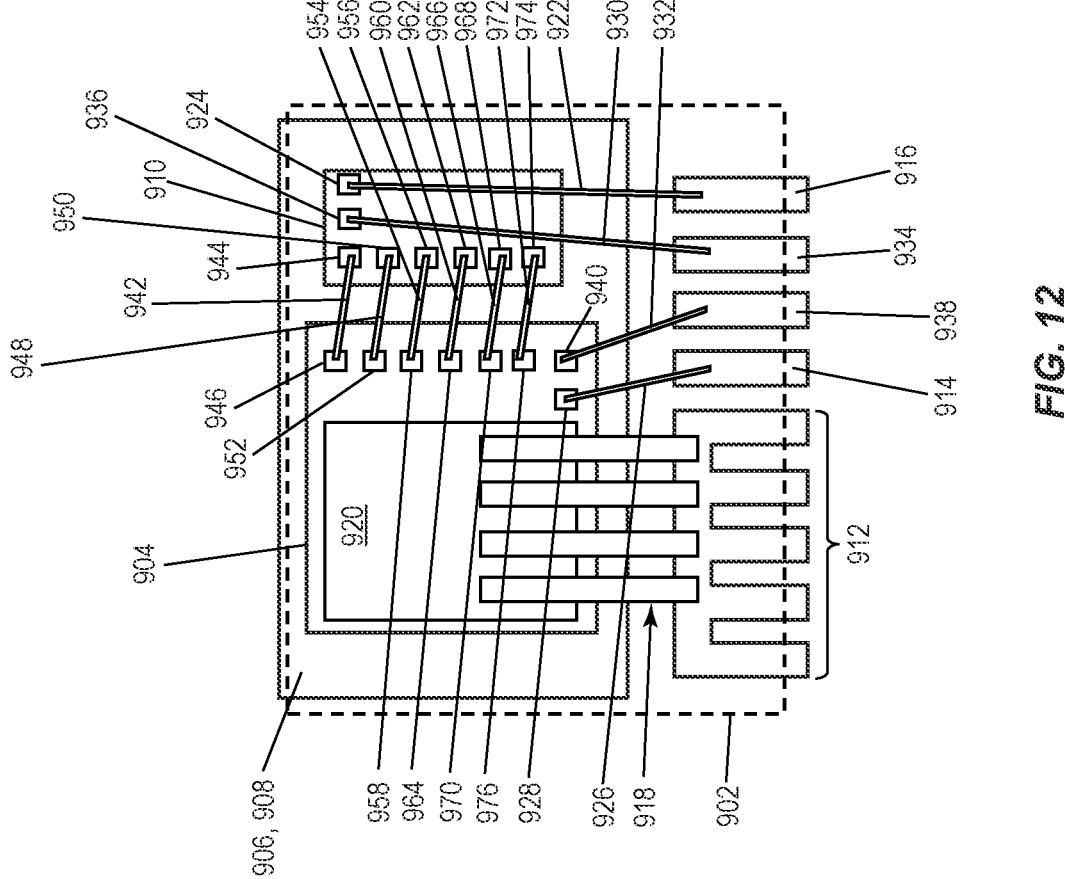
FIG. 12 illustrates a top plan view of a molded surface mount system-in-package (SiP) looking through the mold compound of the SiP.

FIG. 12 illustrates a top plan view of a molded surface mount system-in-package (SiP) 900 looking through the mold compound 902 of the SiP 900, to provide an unobstructed view of the package interior. Accordingly, a dashed rectangle is used to represent the mold compound 902 in FIG. 12.

The molded surface mount SiP 900 also includes a power semiconductor die (chip) 904 encased by the mold compound 902. The power semiconductor die 904 may be a lateral or vertical device. The power semiconductor die 904 is attached to a metallic pad 906 such as a pad of a lead frame, such that a first (back) side of the power semiconductor die 904 faces the metallic pad 906 and a second (front) side of the die 904 faces away from the metallic pad 904. The metallic pad 906 forms a first power terminal 908 such as a drain or collector terminal exposed at the surface mounting side of the molded surface mount SiP 900.

An additional semiconductor die 910 encased in the mold compound 902 is attached to the same or different metallic pad 906 as the power semiconductor die 902. The additional semiconductor die 910 includes a driver device configured to provide a drive input for a gate of a power transistor included in the power semiconductor die 904. The same or different semiconductor technology may be used to implement the power semiconductor die 904 and the additional semiconductor die 910. For example, both the power semiconductor die 904 and the additional semiconductor die 910 may be Si dies. In another example, the power semiconductor die 904 may be a wide bandgap die such as a SiC or GaN die and the additional semiconductor die 910 may be a Si die.

The molded surface mount SiP 900 further includes a second power terminal 912, a first sense terminal 914, and a gate terminal 916 each exposed at the surface mounting side of the SP 900 and spaced apart from the first power terminal 908. A first internal electrical connection 918 is provided between the second power terminal 912 of the SiP 900 and a first power pad 920 (e.g., source or emitter) at the second side of the power semiconductor die 904. A second internal electrical connection 922 is provided between the gate terminal 916 of the SiP 900 and a driver input pad 924 of the additional semiconductor die 910. The driver device included in the additional semiconductor die 910 drives the power transistor included in the power semiconductor die 904 based on a signal present at the gate terminal 916, as applied to the driver input pad 924 of the additional semiconductor die 910.

The molded surface mount SiP 900 also includes a third electrical connection 926 between the first sense terminal 914 of the SiP 900 and a first sense pad 928 at the second side of the power semiconductor die 904. A sense signal (e.g., current, temperature or Kelvin) output at the first sense pad 928 of the power semiconductor die 904 is externally accessible at the first sense terminal 914 of the SiP 900.

The molded surface mount SiP 900 includes a redundant internal electrical connection for the gate internal electrical connection 922 and/or the sense internal electrical connection 926. In FIG. 12, the molded surface mount SiP 900 includes a first redundant internal electrical connection 930 for the gate internal electrical connection 922 and a second redundant internal electrical connection 932 for the sense internal electrical connection 926.

In FIG. 12, the redundant internal gate electrical connection 930 is between a redundant gate terminal 934 exposed at the surface mounting side of the molded surface mount SiP 900 and a redundant gate pad 936 of the additional semiconductor die 910. The redundant internal sense electrical connection 932 is between a redundant sense terminal 938 exposed at the surface mounting side of the SiP 900 and a redundant sense pad 940 of the power semiconductor die 104. However, the redundant internal gate electrical connection 930 and/or the redundant internal sense electrical connection 932 instead may be implemented as shown in FIG. 7, where two bond wires are stacked on top of one another and attached to the same die pad.

The molded surface mount SiP 900 also includes an internal electrical connection 942 between a driver output pad 944 of the additional semiconductor die 910 and a gate pad 946 at the second side of the power semiconductor die 904. The driver device included in the additional semiconductor die 910 provides the drive input signal to the power semiconductor die 904 via the driver output pad 944. A redundant internal electrical connection 948 is provided for the internal driver output electrical connection 942. In FIG. 12, the redundant internal driver output electrical connection 948 is between a redundant driver output pad 950 of the additional semiconductor die 910 and a redundant gate pad 952 at the second side of the power semiconductor die 904. However, the redundant internal driver output electrical connection 948 instead may be implemented as shown in FIG. 7, where two bond wires are stacked on top of one another and attached to the redundant driver output pad 950 of the additional semiconductor die 910 and/or the redundant gate pad 952 of the power semiconductor die 904.

The power semiconductor die 904 may have one or more sense outputs that are provided to the additional semiconductor die 910, to ensure safe operation of the power transistor included in the power semiconductor die 904. For example, a die-to-die electrical connection 954 may be provided between a current sense input pad 956 of the additional semiconductor die 910 and a current sense output pad 958 at the second side of the power semiconductor die 904 and a redundant electrical connection 960 may be provided for the die-to-die current sense electrical connection 954.

In FIG. 12, the redundant die-to-die current sense electrical connection 960 is between a redundant current sense input pad 962 of the additional semiconductor die 910 and a redundant current sense output pad 964 at the second side of the power semiconductor die 904. However, the redundant die-to-die current sense electrical connection 960 instead may be implemented as shown in FIG. 7, where two bond wires are stacked on top of one another and attached to the redundant current sense input pad 962 of the additional semiconductor die 910 and/or the redundant current sense output pad 964 of the power semiconductor die 904.

A die-to-die electrical connection 966 also may be provided between a Kelvin sense input pad 968 of the additional semiconductor die 910 and a Kelvin sense output pad 970 at the second side of the power semiconductor die 904 and a redundant electrical connection 972 may be provided for the die-to-die Kelvin sense electrical connection 966. In FIG. 12, the redundant die-to-die Kelvin sense electrical connection 972 is between a redundant Kelvin sense input pad 974 of the additional semiconductor die 910 and a redundant Kelvin sense output pad 976 at the second side of the power semiconductor die 904. However, the redundant die-to-die Kelvin sense electrical connection 972 instead may be implemented as shown in FIG. 7, where two bond wires are stacked on top of one another and attached to the redundant Kelvin sense input pad 974 of the additional semiconductor die 910 and/or the redundant Kelvin sense output pad 976 of the power semiconductor die 904.

The mold compound 902 encases the power semiconductor die 904, the additional semiconductor die 910, each internal electrical connection 918, 922, 926, 942, 954, 966, and each redundant internal electrical connection 930, 932, 948, 960, 972. The internal electrical connections 918, 922, 926, 942, 954, 966 and the redundant internal electrical connections 930, 932, 948, 960, 972 are shown as being implemented using bond wires in FIG. 12. However, one or more of the internal electrical connections 918, 922, 926, 942, 954, 966 and/or one or more of the redundant internal electrical connections 930, 932, 948, 960, 972 instead may be implemented using metal ribbons, metallic clips, etc.

Although the present disclosure is not so limited, the following numbered examples demonstrate one or more aspects of the disclosure.

Example 1. A surface mount package, comprising: a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount package; a second power terminal, a first sense terminal, and a gate terminal each exposed at the surface mounting side and spaced apart from the first power terminal; a first electrical connection between the second power terminal and a first power pad at the second side of the power semiconductor die; a second electrical connection between the gate terminal and a gate pad at the second side of the power semiconductor die; a third electrical connection between the first sense terminal and a first sense pad at the second side of the power semiconductor die; a first redundant electrical connection for the second electrical connection or the third electrical connection; and a mold compound encasing each of the power semiconductor die, the first electrical connection, the second electrical connection, the third electrical connection, and the first redundant electrical connection.

Example 2. The surface mount package of example 1, wherein the first redundant electrical connection is between a redundant gate terminal exposed at the surface mounting side and a redundant gate pad at the second side of the power semiconductor die.

Example 3. The surface mount package of example 1, wherein the first redundant electrical connection is between a redundant sense terminal exposed at the surface mounting side and a redundant sense pad at the second side of the power semiconductor die.

Example 4. The surface mount package of example 1 or 2, wherein the first redundant electrical connection is for the second electrical connection, wherein the surface mount package further comprises a second redundant electrical connection for the third electrical connection, and wherein the mold compound encases the second redundant electrical connection.

Example 5. The surface mount package of example 4, wherein the first redundant electrical connection is between a redundant gate terminal exposed at the surface mounting side and a redundant gate pad at the second side of the power semiconductor die, and wherein the second redundant electrical connection is between a redundant sense terminal exposed at the surface mounting side and a redundant sense pad at the second side of the power semiconductor die.

Example 6. The surface mount package of example 1 or 3, wherein the first sense pad at the second side of the power semiconductor die is a Kelvin sense pad, wherein the first sense terminal exposed at the surface mounting side is a Kelvin sense terminal, and wherein the first redundant electrical connection is between a redundant Kelvin sense terminal exposed at the surface mounting side and a redundant Kelvin sense pad at the second side of the power semiconductor die.

Example 7. The surface mount package of example 6, further comprising: a temperature sense terminal exposed at the surface mounting side; a fourth electrical connection between the temperature sense terminal and a temperature sense pad at the second side of the power semiconductor die; and a second redundant electrical connection for the fourth electrical connection, wherein the mold compound encases the fourth electrical connection and the second redundant electrical connection.

Example 8. The surface mount package of example 7, wherein the second redundant electrical connection is between a redundant temperature sense terminal exposed at the surface mounting side and a redundant temperature sense pad at the second side of the power semiconductor die.

Example 9. The surface mount package of example 7 or 8, further comprising: a third redundant electrical connection for the second electrical connection, wherein the mold compound encases the third redundant electrical connection.

Example 10. The surface mount package of example 9, wherein the third redundant electrical connection is between a redundant gate terminal exposed at the surface mounting side and a redundant gate pad at the second side of the power semiconductor die.

Example 11. The surface mount package of any of examples 7 through 10, further comprising: a current sense terminal exposed at the surface mounting side; a fifth electrical connection between the current sense terminal and a current sense pad at the second side of the power semiconductor die; and a third redundant electrical connection for the fifth electrical connection, wherein the mold compound encases the fifth electrical connection and the third redundant electrical connection.

Example 12. The surface mount package of example 11, wherein the third redundant electrical connection is between a redundant current sense terminal exposed at the surface mounting side and a redundant current sense pad at the second side of the power semiconductor die.

Example 13. The surface mount package of example 1, wherein the first redundant electrical connection is between a redundant gate terminal exposed at the surface mounting side and the gate pad at the second side of the power semiconductor die.

Example 14. The surface mount package of example 13, wherein the second electrical connection comprises a first bond wire having a first end attached to the gate terminal exposed at the surface mounting side and a second end attached to the gate pad at the second side of the power semiconductor die, and wherein the first redundant electrical connection comprises a second bond wire having a first end attached to the redundant gate terminal exposed at the surface mounting side and a second end stacked on and attached to the second end of the first bond wire.

Example 15. The surface mount package of example 1, wherein the first redundant electrical connection is between a redundant sense terminal exposed at the surface mounting side and the first sense pad at the second side of the power semiconductor die.

Example 16. The surface mount package of example 15, wherein the third electrical connection comprises a first bond wire having a first end attached to the first sense terminal exposed at the surface mounting side and a second end attached to the first sense pad at the second side of the power semiconductor die, and wherein the first redundant electrical connection comprises a second bond wire having a first end attached to the redundant sense terminal exposed at the surface mounting side and a second end stacked on and attached to the second end of the first bond wire.

Example 17. The surface mount package of any of examples 1 through 16, wherein the power semiconductor die is a vertical power semiconductor die, and wherein the metallic pad is attached and electrically connected to a second power pad at the first side of the power semiconductor die.

Example 18. The surface mount package of any of examples 1 through 16, wherein the power semiconductor die is a lateral power semiconductor die having all electrical contact pads at the second side of the power semiconductor die, wherein the surface mount package further comprises a fourth electrical connection between the metallic pad and a second power pad at the second side of the power semiconductor die, wherein the first power pad and the second power pad at the second side of the power semiconductor die are at different electric potentials, and wherein the mold compound encases the fourth electrical connection.

Example 19. The surface mount package of any of examples 1 through 18, wherein the metallic pad is a die pad of a lead frame, and wherein the second power terminal, the first sense terminal, and the gate terminal are separate leads of the lead frame.

Example 20. A surface mount system-in-package, comprising: a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount system-in-package; an additional semiconductor die attached to the same or different metallic pad as the power semiconductor die, the additional semiconductor die comprising a driver device configured to provide a drive input for a gate of a power transistor included in the power semiconductor die; a second power terminal, a first sense terminal, and a gate terminal each exposed at the surface mounting side and spaced apart from the first power terminal; a first electrical connection between the second power terminal and a first power pad at the second side of the power semiconductor die; a second electrical connection between the gate terminal and a driver input pad of the additional semiconductor die; a third electrical connection between the first sense terminal and a first sense pad at the second side of the power semiconductor die; a first redundant electrical connection for the second electrical connection or the third electrical connection; and a mold compound encasing each of the power semiconductor die, the additional semiconductor die, the first electrical connection, the second electrical connection, the third electrical connection, and the first redundant electrical connection.

Example 21. The molded surface mount system-in-package of example 20, further comprising: a fourth electrical connection between a driver output pad of the additional semiconductor die and a gate pad at the second side of the power semiconductor die; and a second redundant electrical connection for the fourth electrical connection, wherein the mold compound encases the fourth electrical connection and the second redundant electrical connection.

Example 22. The molded surface mount system-in-package of example 21, further comprising: a fifth electrical connection between a current sense input pad of the additional semiconductor die and a current sense output pad at the second side of the power semiconductor die; and a third redundant electrical connection for the fifth electrical connection, wherein the mold compound encases the fifth electrical connection and the third redundant electrical connection.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A surface mount package, comprising:

a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount package;

a second power terminal, a first sense terminal, and a gate terminal each exposed at the surface mounting side and spaced apart from the first power terminal;

a first electrical connection between the second power terminal and a first power pad at the second side of the power semiconductor die;

a second electrical connection between the gate terminal and a gate pad at the second side of the power semiconductor die;

a third electrical connection between the first sense terminal and a first sense pad at the second side of the power semiconductor die;

a first redundant electrical connection for the second electrical connection or the third electrical connection; and a mold compound encasing each of the power semiconductor die, the first electrical connection, the second electrical connection, the third electrical connection, and the first redundant electrical connection.

2. The surface mount package of claim 1, wherein the first redundant electrical connection is between a redundant gate terminal exposed at the surface mounting side and a redundant gate pad at the second side of the power semiconductor die.

3. The surface mount package of claim 1, wherein the first redundant electrical connection is between a redundant sense terminal exposed at the surface mounting side and a redundant sense pad at the second side of the power semiconductor die.

4. The surface mount package of claim 1, wherein the first redundant electrical connection is for the second electrical connection, wherein the surface mount package further comprises a second redundant electrical connection for the third electrical connection, and wherein the mold compound encases the second redundant electrical connection.

5. The surface mount package of claim 4, wherein the first redundant electrical connection is between a redundant gate terminal exposed at the surface mounting side and a redundant gate pad at the second side of the power semiconductor die, and wherein the second redundant electrical connection is between a redundant sense terminal exposed at the surface mounting side and a redundant sense pad at the second side of the power semiconductor die.

6. The surface mount package of claim 1, wherein the first sense pad at the second side of the power semiconductor die is a Kelvin sense pad, wherein the first sense terminal exposed at the surface mounting side is a Kelvin sense terminal, and wherein the first redundant electrical connection is between a redundant Kelvin sense terminal exposed at the surface mounting side and a redundant Kelvin sense pad at the second side of the power semiconductor die.

7. The surface mount package of claim 6, further comprising:
a temperature sense terminal exposed at the surface mounting side;
a fourth electrical connection between the temperature sense terminal and a temperature sense pad at the second side of the power semiconductor die; and
a second redundant electrical connection for the fourth electrical connection,
wherein the mold compound encases the fourth electrical connection and the second redundant electrical connection.

8. The surface mount package of claim 7, wherein the second redundant electrical connection is between a redundant temperature sense terminal exposed at the surface mounting side and a redundant temperature sense pad at the second side of the power semiconductor die.

9. The surface mount package of claim 7, further comprising:
a third redundant electrical connection for the second electrical connection,
wherein the mold compound encases the third redundant electrical connection.

10. The surface mount package of claim 9, wherein the third redundant electrical connection is between a redundant gate terminal exposed at the surface mounting side and a redundant gate pad at the second side of the power semiconductor die.

11. The surface mount package of claim 7, further comprising:

a current sense terminal exposed at the surface mounting side;
a fifth electrical connection between the current sense terminal and a current sense pad at the second side of the power semiconductor die; and
a third redundant electrical connection for the fifth electrical connection,
wherein the mold compound encases the fifth electrical connection and the third redundant electrical connection.

12. The surface mount package of claim 11, wherein the third redundant electrical connection is between a redundant current sense terminal exposed at the surface mounting side and a redundant current sense pad at the second side of the power semiconductor die.

13. The surface mount package of claim 1, wherein the first redundant electrical connection is between a redundant gate terminal exposed at the surface mounting side and the gate pad at the second side of the power semiconductor die.

14. The surface mount package of claim 13, wherein the second electrical connection comprises a first bond wire having a first end attached to the gate terminal exposed at the surface mounting side and a second end attached to the gate pad at the second side of the power semiconductor die, and wherein the first redundant electrical connection comprises a second bond wire having a first end attached to the redundant gate terminal exposed at the surface mounting side and a second end stacked on and attached to the second end of the first bond wire.

15. The surface mount package of claim 1, wherein the first redundant electrical connection is between a redundant sense terminal exposed at the surface mounting side and the first sense pad at the second side of the power semiconductor die.

16. The surface mount package of claim 15, wherein the third electrical connection comprises a first bond wire having a first end attached to the first sense terminal exposed at the surface mounting side and a second end attached to the first sense pad at the second side of the power semiconductor die, and wherein the first redundant electrical connection comprises a second bond wire having a first end attached to the redundant sense terminal exposed at the surface mounting side and a second end stacked on and attached to the second end of the first bond wire.

17. The surface mount package of claim 1, wherein the power semiconductor die is a vertical power semiconductor die, and wherein the metallic pad is attached and electrically connected to a second power pad at the first side of the power semiconductor die.

18. The surface mount package of claim 1, wherein the power semiconductor die is a lateral power semiconductor die having all electrical contact pads at the second side of the power semiconductor die, wherein the surface mount package further comprises a fourth electrical connection between the metallic pad and a second power pad at the second side of the power semiconductor die, wherein the first power pad and the second power pad at the second side of the power semiconductor die are at different electric potentials, and wherein the mold compound encases the fourth electrical connection.

19. The surface mount package of claim 1, wherein the metallic pad is a die pad of a lead frame, and wherein the second power terminal, the first sense terminal, and the gate terminal are separate leads of the lead frame.

20. A surface mount system-in-package, comprising:
a power semiconductor die attached to a metallic pad such that a first side of the power semiconductor die faces the metallic pad and a second side opposite the first side faces away from the metallic pad, the metallic pad forming a first power terminal exposed at a surface mounting side of the surface mount system-in-package;

an additional semiconductor die attached to the same or different metallic pad as the power semiconductor die, the additional semiconductor die comprising a driver device configured to provide a drive input for a gate of a power transistor included in the power semiconductor die;

a second power terminal, a first sense terminal, and a gate terminal each exposed at the surface mounting side and spaced apart from the first power terminal;

a first electrical connection between the second power terminal and a first power pad at the second side of the power semiconductor die;

a second electrical connection between the gate terminal and a driver input pad of the additional semiconductor die;

a third electrical connection between the first sense terminal and a first sense pad at the second side of the power semiconductor die;

a first redundant electrical connection for the second electrical connection or the third electrical connection; and a mold compound encasing each of the power semiconductor die, the additional semiconductor die, the first electrical connection, the second electrical connection, the third electrical connection, and the first redundant electrical connection.

21. The molded surface mount system-in-package of claim 20, further comprising:

a fourth electrical connection between a driver output pad of the additional semiconductor die and a gate pad at the second side of the power semiconductor die; and a second redundant electrical connection for the fourth electrical connection, wherein the mold compound encases the fourth electrical connection and the second redundant electrical connection.

22. The molded surface mount system-in-package of claim 21, further comprising:

a fifth electrical connection between a current sense input pad of the additional semiconductor die and a current sense output pad at the second side of the power semiconductor die; and a third redundant electrical connection for the fifth electrical connection, wherein the mold compound encases the fifth electrical connection and the third redundant electrical connection.

* * * * *